United States Patent
Dijksman et al.

(10) Patent No.: US 9,462,667 B2
(45) Date of Patent: Oct. 4, 2016

(54) RADIATION SOURCE AND LITHOGRAPHIC APPARATUS

(71) Applicant: ASML Netherlands B.V., Veldhoven (NL)

(72) Inventors: Johan Frederik Dijksman, Weert (NL); Ronald Johannes Hultermans, Waalre (NL); Antonius Theodorus Wilhelmus Kempen, Den Bosch (NL); Ramin Badie, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 40 days.

(21) Appl. No.: 14/377,586

(22) PCT Filed: Jan. 3, 2013

(86) PCT No.: PCT/EP2013/050055
§ 371 (c)(1),
(2) Date: Aug. 8, 2014

(87) PCT Pub. No.: WO2013/117355
PCT Pub. Date: Aug. 15, 2013

(65) Prior Publication Data
US 2015/0055106 A1 Feb. 26, 2015

Related U.S. Application Data (60) Provisional application No. 61/596,355, filed on Feb. 8, 2012.

(51) Int. Cl.
*G03B 27/32* (2006.01)
*G03B 27/54* (2006.01)
(Continued)

(52) U.S. Cl.
CPC .......... *H05G 2/006* (2013.01); *G03F 7/70033* (2013.01); *G03F 7/70908* (2013.01); *G03F 7/70916* (2013.01); *H05G 2/005* (2013.01)

(58) Field of Classification Search
CPC .......... G03F 7/70033; G03F 7/70883; G03F 7/70908; G03F 7/70916; H05G 2/00–2/008
USPC ....................................... 355/67, 77
See application file for complete search history.

(56) References Cited

U.S. PATENT DOCUMENTS 6,647,088 B1  11/2003  Schmidt et al.
7,718,985 B1 * 5/2010  Bernath ............... H05G 2/008
                                                            250/492.2
(Continued)

FOREIGN PATENT DOCUMENTS

EP         2 154 574 A2     2/2010

OTHER PUBLICATIONS

International Search Report directed to related International Patent Application No. PCT/EP2013/050055, mailed May 7, 2013; 4 pages.
(Continued)

*Primary Examiner* — Colin Kreutzer
(74) *Attorney, Agent, or Firm* — Sterne, Kessler, Goldstein & Fox P.L.L.C.

(57) ABSTRACT

The present invention provides methods and apparatus for facilitating the start up of a fuel droplet stream generator. During a start-up phase the fuel droplet stream generator is positioned so that the fuel droplets re emitted downwardly whereby gravity assists in the establishment of the stream. The droplets are monitored using a visualization system and once the stream is determined to have the desired characteristics the stream generator is moved to a second position of steady state use in which the droplet stream is emitted in a horizontal direction.

20 Claims, 8 Drawing Sheets

(51) Int. Cl.
*H05G 2/00* (2006.01)
*G03F 7/20* (2006.01)

(56) References Cited

U.S. PATENT DOCUMENTS

| | | | |
|---|---|---|---|
| 7,872,245 B2 | 1/2011 | Vaschenko et al. | |
| 2004/0135517 A1 | 7/2004 | Schriever et al. | |
| 2009/0127479 A1 | 5/2009 | Hosokai et al. | |
| 2009/0301517 A1 | 12/2009 | Asayama et al. | |
| 2010/0025223 A1* | 2/2010 | Yanagida | H05G 2/003 204/157.15 |
| 2010/0039631 A1* | 2/2010 | Loopstra | G03F 7/70033 355/67 |
| 2010/0294958 A1 | 11/2010 | Hayashi et al. | |
| 2011/0174996 A1 | 7/2011 | Someya et al. | |
| 2013/0119232 A1* | 5/2013 | Moriya | H05G 2/008 250/201.1 |
| 2013/0153792 A1* | 6/2013 | Baumgart | F16C 11/12 250/504 R |
| 2014/0203194 A1* | 7/2014 | Nagano | G03F 7/70025 250/494.1 |

OTHER PUBLICATIONS

International Preliminary Report on Patentability and Written Opinion of the International Searching Authority directed to related International Patent Application No. PCT/EP2013/050055, issued Aug. 12, 2014; 7 pages.

Jansson, P.A. C., et al., "Liquid-tin-jet laser-plasma extreme ultraviolet generation," Applied Physics Letters, vol. 84, No. 13, Mar. 29, 2004; pp. 2256-2258.

* cited by examiner

RADIATION SOURCE AND LITHOGRAPHIC APPARATUS

CROSS-REFERENCE TO RELATED APPLICATIONS

This application claims the benefit of U.S. provisional application 61/596,355, which was filed on Feb. 8, 2012, and which is incorporated herein in its entirety by reference.

FIELD

The present invention relates to a radiation source and to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \qquad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as droplets of a suitable material (e.g., tin), or a stream of a suitable gas or vapor, such as Xe gas or Li vapor. The resulting plasma emits output radiation, e.g. EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

Another known method of producing EUV radiation is known as dual laser pulsing (DLP). In the DLP method droplets are pre-heated by a Nd:YAG laser to cause the droplet (e.g., a tin droplet) to decompose into vapour and small particles that are then heated to a very high temperature by a $CO_2$ laser.

In known methods such as LPP and DLP methods a stream of droplets must be generated. The droplets may be generated as either a continuous stream or in pulses.

For example, in one known method that is used in particular for LPP methods a heated container is filled with molten tin that passes from the container to a capillary via a filter and a piezoelectric actuator. A continuous jet issues from the end of the capillary that is modulated in velocity by the piezoelectric actuator. During flight this jet decomposes into small droplets and due to the modulated velocity these smaller droplets merge into larger droplets spaced at larger distances.

In another known method droplets (e.g., liquid tin) are extracted from the end of a nozzle held at high-voltage using an extraction electrode that is switched pulse-wise between the high voltage of the nozzle and ground (or at least to a voltage between the high voltage and ground). The droplets are then accelerated by means of a grounded acceleration electrode and further electrodes are used for adjusting the flight trajectory of the droplets. The pulse length for the extraction electrode is chosen such that the droplet is released completely, has been fully charged and has passed the position of the extraction electrode. From the moment that the extraction electrode is switched back to a high voltage the droplet is accelerated further in the field between the extraction electrode and the acceleration electrode.

A difficulty with such prior methods, however, is that during start up of the droplet generator the speed and direction of the droplets may vary until a steady state operation is achieved. This means that the droplets may land in other parts of the EUV source such as electrodes, sensors and the like. Such contamination—especially for example where the droplets are of a material such as tin—can over time have significant deleterious effects on the operation of the droplet generator.

SUMMARY

According to a first aspect of the invention there is provided a radiation source fuel droplet stream generator comprising a fuel droplet emitter configured to generating a stream of fuel droplets, wherein said fuel droplet emitter is configured to be moved between a first position for start-up during which said fuel droplets are emitted in a first direction, and a second position for steady state use during which a stream of droplets in a second direction is generated.

Preferably the first position is a vertical position in which the droplet stream is generated in a downward direction whereby gravity may assist in formation of the droplet stream. Preferably the second position is a substantially horizontal position in which the droplet stream is generated in a substantially horizontal direction.

Preferably embodiments of the invention further comprise a droplet visualization system for enabling examination of fuel droplets. The visualization system may comprise means for recording images of the droplets and means for processing the images to determine droplet parameters. The visualization system may for example comprise a camera, a microscope objective and a stroboscope. Preferably the visualization system comprises means for viewing the droplets from two directions.

Preferably the visualization system comprises means for providing feedback control to the fuel droplet emitter.

In embodiments of the invention the fuel droplet stream generator is preferably rotated between the first and second positions when the visualization system determines that steady state stream of droplets meeting predefined characteristics has been established. In some embodiments of the invention the fuel droplet stream generator comprises a fuel reservoir connected to the fuel droplet emitter. The reservoir is configured to be rotatable about a longitudinal axis disposed at an angle to a longitudinal axis of the emitter whereby rotation of the reservoir about its axis causes the emitter to be moved between the first and second positions. For example, the reservoir may be provided with a toothed flange, and the reservoir is rotatably driven by an electric motor driving a pinion wheel that engages the toothed flange.

Alternatively the stream generator may be moved between said positions by a robot arm.

The invention also extends to a radiation source comprising a fuel droplet stream generator as defined above, and to a lithographic apparatus comprising the radiation source. The lithographic apparatus further comprises an illumination system configured to condition a radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate.

According to another aspect of the present invention there is provided a method of generating a fuel droplet stream using a fuel droplet stream generator. The method comprises operating said fuel droplet stream generator in a first position so as to generate a stream of fuel droplets in a first direction until a steady state stream is generated and then moving said fuel droplet stream generator into a second position in which a fuel droplet stream is generated in a second direction.

Preferably the first position is a vertical position in which the droplet stream is generated in a downward direction whereby gravity may assist in establishing the droplet stream. Preferably the second position is a substantially horizontal position in which the droplet stream is generated in a substantially horizontal direction.

In preferred embodiments of the invention the method further comprises deciding when to move the fuel droplet stream generator between said first and second positions is based upon the properties of droplets forming said stream. Preferably the step of deciding when to rotate the fuel droplet stream generator comprises inspecting the droplets to determine whether the droplets meet predefined droplet characteristics. To achieve this the droplets may be inspected by capturing images of said droplets, preferably from two directions.

Further features and advantages as well as the structure and operation of various embodiments are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Embodiments are described below with reference to the accompanying drawings.

In the drawings, like reference numbers generally refer to identical or functionally similar elements. Additionally, the leftmost digit(s) of a reference number generally identifies the drawing in which the reference number first appears.

DETAILED DESCRIPTION

It is noted that reference in this specification to "one embodiment," "an embodiment," "an example embodiment," etc., indicate that the embodiment described may include a particular feature, structure, or characteristic, but not every embodiment may necessarily include the particular feature, structure, or characteristic. Moreover, such phrases are not necessarily referring to the same embodiment. Further, when a particular feature, structure, or characteristic, is described in connection with an embodiment, it is submitted that it is within the knowledge of one skilled in the art to effect such feature, structure, or characteristic, in connection with other embodiments whether or not explicitly described.

Figure 1:
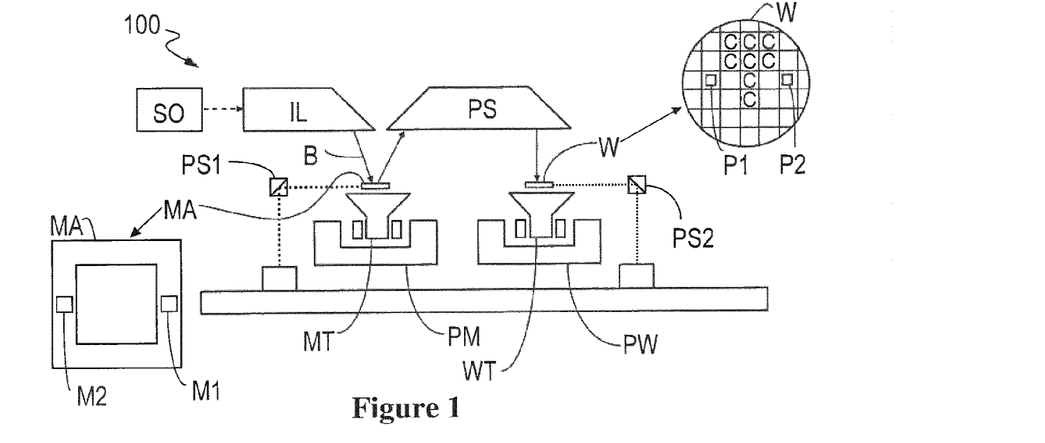
FIG. 1 schematically depicts a lithographic apparatus according to an embodiment of the invention.

FIG. 1 schematically depicts a lithographic apparatus 100 according to an embodiment of the invention. The lithographic apparatus includes an EUV radiation source according to an embodiment of the invention. The apparatus comprises:

- an illumination system (illuminator) IL configured to condition a radiation beam B (e.g., EUV radiation).
- a support structure (e.g., a mask table) MT constructed to support a patterning device (e.g., a mask or a reticle) MA and connected to a first positioner PM configured to accurately position the patterning device;
- a substrate table (e.g., a wafer table) WT constructed to hold a substrate (e.g., a resist-coated wafer) W and connected to a second positioner PW configured to accurately position the substrate; and
- a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultraviolet (EUV) radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet of material having the required line-emitting element, with a laser beam. The source collector module SO may be part of an EUV radiation source including a laser, not shown in FIG. 1, for providing the laser beam exciting the fuel. The resulting plasma emits output radiation, e.g. EUV radiation, which is collected using a radiation collector, disposed in the source collector module.

The laser and the source collector module may be separate entities, for example when a $CO_2$ laser is used to provide the laser beam for fuel excitation. In such cases, the radiation beam is passed from the laser to the source collector module with the aid of a beam delivery system comprising, for example, suitable directing mirrors and/or a beam expander. The laser and a fuel supply may be considered to comprise an EUV radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensing system PS2 (e.g., using interferometric devices, linear encoders or capacitive sensors), the substrate table WT can be moved accurately, e.g. so as to position different target portions C in the path of the radiation beam B. Similarly, the first positioner PM and another position sensing system PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.
2. In scan mode, the support structure (e.g., mask table) MT and the substrate table WT are scanned synchronously while a pattern imparted to the radiation beam is projected onto a target portion C (i.e., a single dynamic exposure).

The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
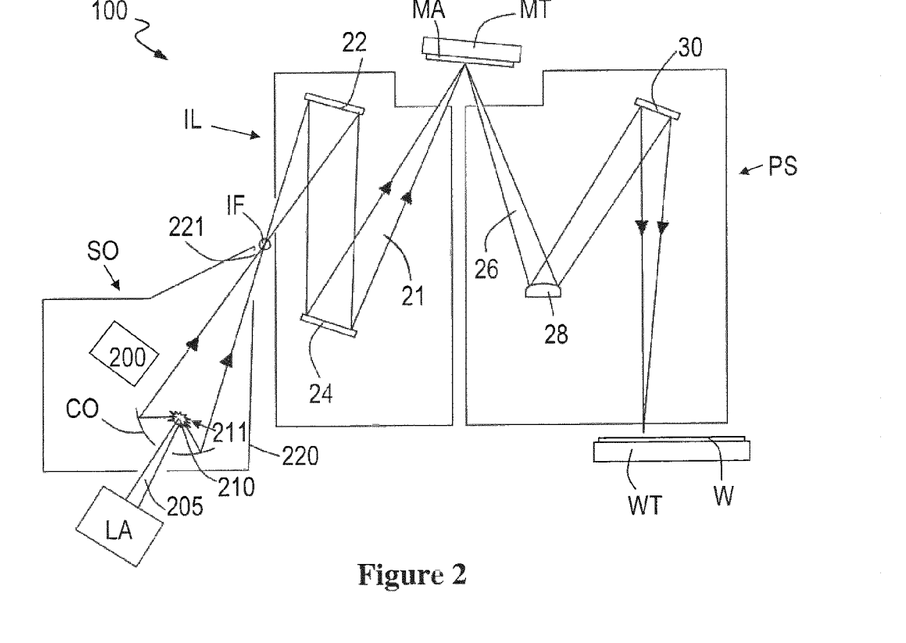
FIG. 2 is a more detailed view of the apparatus of FIG. 1, including an LPP source collector module.

FIG. 2 shows the lithographic apparatus 100 in more detail, including the source collector module SO, the illumination system IL, and the projection system PS. The source collector module SO is constructed and arranged such that a vacuum environment can be maintained in an enclosing structure 220 of the source collector module.

A laser LA is arranged to deposit laser energy via a laser beam 205 into a fuel, such as xenon (Xe), tin (Sn) or lithium (Li) which is provided from a fuel droplet stream generator 200. This creates a highly ionized plasma 210 at a plasma formation location 211 which has electron temperatures of several 10's of eV. The energetic radiation generated during de-excitation and recombination of these ions is emitted from the plasma, collected and focussed by a near normal incidence radiation collector CO. The laser LA and fuel droplet stream generator 200 may together be considered to comprise an EUV radiation source. The EUV radiation source may be referred to as a laser produced plasma (LPP) source.

A second laser (not shown) may be provided, the second laser being configured to preheat the fuel before the laser beam 205 is incident upon it. An LPP source which uses this approach may be referred to as a dual laser pulsing (DLP) source.

Radiation that is reflected by the radiation collector CO is focused at a virtual source point IF. The virtual source point IF is commonly referred to as the intermediate focus, and the source collector module SO is arranged such that the intermediate focus IF is located at or near to an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21 at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in the illumination system IL and projection system PS. Furthermore, there may be more mirrors present than those shown in the figures, for example there may be 1-6 additional reflective elements present in the projection system PS than shown in FIG. 2. One feature of the source collector module SO which is worthy of note is that the laser source is angled which means that the stream of fuel droplets supplied to the laser source LA should be substantially horizontal to avoid fuel droplets striking the collector CO.

Figure 3:
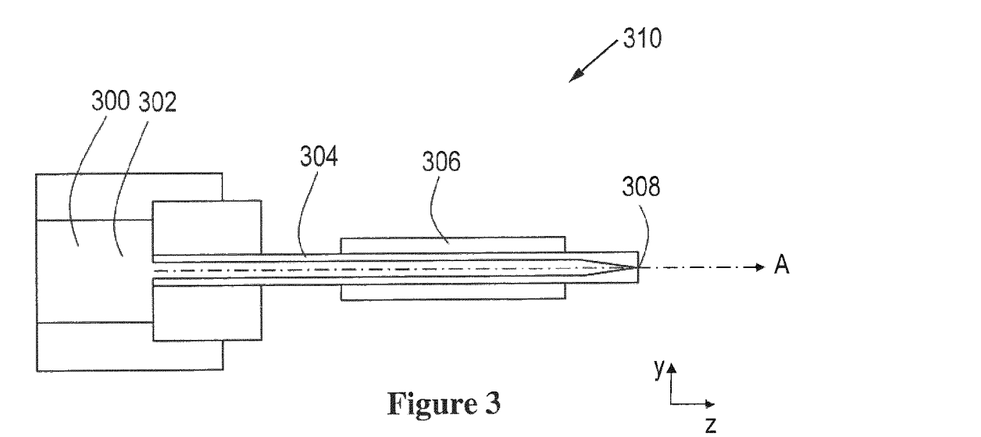
FIG. 3 schematically depicts a fuel droplet emitter which may form part of the lithographic apparatus shown in FIGS. 1 and 2.

FIG. 3 schematically shows a fuel droplet emitter 310 of the fuel droplet stream generator. The fuel droplet emitter 310 comprises a reservoir 300 which contains a fuel liquid 302 (for example liquid tin). The reservoir 300 is connected to a capillary 304 which is encircled by a piezo-electric actuator 306. A firm connection is provided between the piezo-electric actuator 306 and the capillary 304 (e.g., using a suitable bonding material) such that vibrations may travel from the piezo-electric actuator to the capillary. The capillary 304 is provided with a nozzle 308 from which fuel material is ejected along a trajectory A. The trajectory A is coaxial with an axis which runs along the centre of the capillary 304, as is represented schematically by the dotted line which passes through the centre of the capillary.

In an embodiment, the nozzle 308 may have a diameter of 3-5 microns. The capillary 304 may for example be 25 millimeters long, with an outer diameter of 1 millimeter and a wall thickness of 0.2 millimeters. The piezo-electric actuator 306 may for example be around 10 mm long, and may be fixed to the capillary 304 using an adhesive. The adhesive may be a high temperature adhesive, i.e. one which does not loose adhesion at the operating temperature of the fuel supply 200. The piezo-electric actuator 306 with its drive electronics (not shown) is configured such that it may squeeze the capillary 304 with a desired modulation frequency, thereby modulating the pressure within the capillary with the effect that the speed of the stream may be varied.

In use, the liquid fuel 302 is held at pressure inside the reservoir 300. This may be achieved for example by pressuring gas (not shown) which is also located in the reservoir 300, such that pressure is applied to the liquid fuel by the gas. As a result of the pressure a stream of fuel issues from the nozzle 308. In the absence of the piezo-electric actuator 306 the stream would naturally break-up after travelling a distance from the nozzle 308 (the distance being for example 100-1000 times the diameter of the nozzle), thereby forming a stream of droplets. This is referred to as Rayleigh break-up. When Rayleigh break-up occurs, fuel droplets are formed with a diameter which is around twice the diameter of the nozzle 308 or slightly less than this, and with a separation around 4.5 times the diameter of the nozzle. Although Rayleigh break-up of the stream of fuel liquid will occur without actuation of the piezo-electric actuator 306, the piezo-electric actuator 306 may be used to control the Rayleigh break-up by modulating the pressure inside the capillary 304.

It is important to note, however, the other types of fuel droplet emitter may be used in embodiments of this invention. In particular possible droplet emitters include those that generate a continuous stream of droplets by a Rayleigh break-up mechanism that can be assisted or mechanical tuned. Other possible droplet emitters are those that may be termed droplet-on-demand emitters in which droplets are produced by some mechanical and/or electrical stimulus. The resulting droplet stream of the droplet-on-demand emitters can have a constant droplet frequency. Alternatively, the time between droplets can be varied as required.

Figure 4:
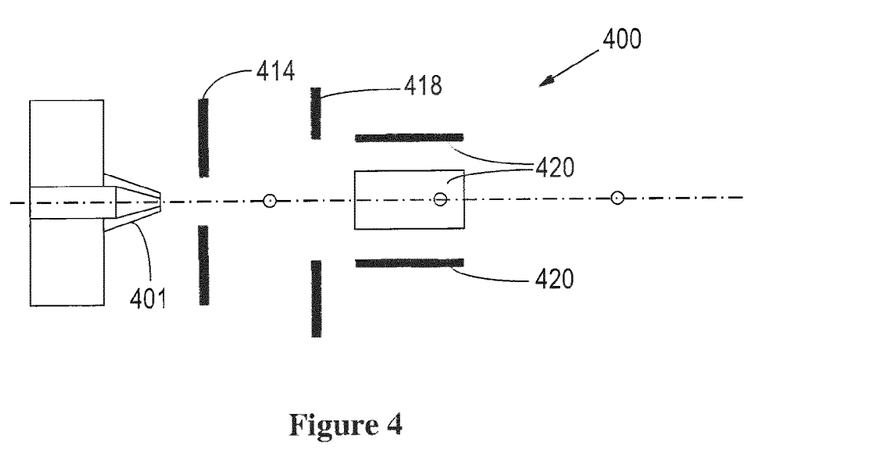
FIG. 4 schematically depicts a fuel droplet stream generator which may form part of a radiation source according to an embodiment of the invention.

FIG. 4 schematically illustrates another form of fuel droplet stream generator 400. The fuel droplet stream generator 400 includes a fuel droplet nozzle 401, and further includes a first electrode 414 acting as an extraction electrode and a second electrode 418 acting as an acceleration electrode. The nozzle 401 is kept at high voltage at all times and the acceleration electrode 418 is grounded. The extraction electrode 414 is switched pulse-wise between the high voltage of the nozzle and ground (or to an intermediate voltage). The pulse length is chosen so that the droplet is released completely, has been fully charged and has passed the position of the extraction electrode 414. From that moment the extraction electrode 414 is switched back to the high voltage and the droplet is accelerated further in the field between electrodes 414, 418. Electrodes 420 may also be provided for adjusting the flight path of the droplets.

Figure 5:
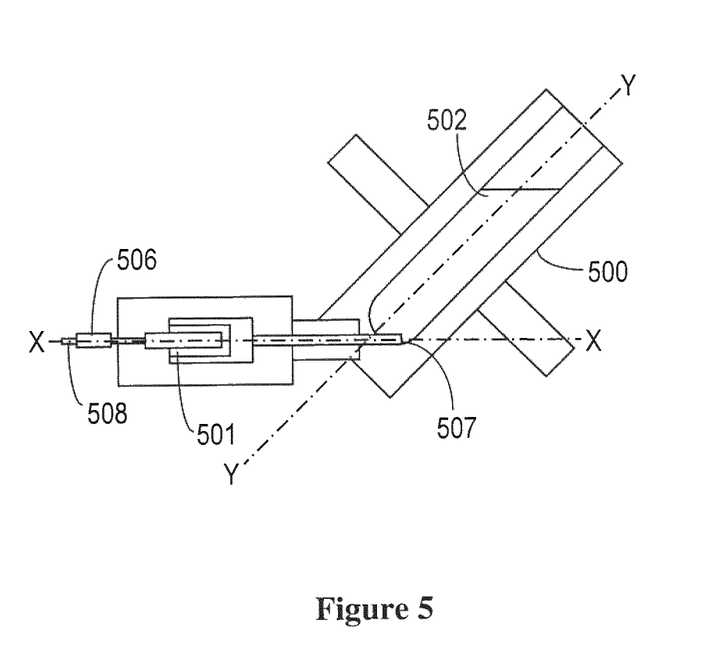
FIG. 5 schematically depicts a fuel droplet stream generator in a position corresponding to steady state use.

FIG. 5 shows schematically a fuel droplet generator similar to FIG. 3 comprising nozzle 508, piezo-electric actuator 506 and a heated reservoir 500 holding molten tin as fuel 502. A high pressure is applied in the container above the surface of the molten tin. In the droplet generator of FIG. 5 a filter unit 501 is located between the reservoir 500 and the piezo-electric actuator 506. It will also be noted that in the droplet generator of FIG. 5 the reservoir 500 is shown offset at an angle to the longitudinal axis of the remainder of the droplet generator. In particular, the nozzle 508, actuator 506 and filter unit 501 define a droplet emitter and all lie on a first principal axis X-X whereas the reservoir 500 has a longitudinal axis Y-Y that is at an acute angle to the first axis X-X. The reservoir 500 is disposed at an angle to the first axis to facilitate the flow of molten tin from the reservoir to the filter unit through a feed 507 that draws molten tin from the bottom of the reservoir 500.

In FIG. 5 the emitter is in a substantially horizontal configuration (up to for example 20° from the horizontal) in which the fluid droplet stream is generally horizontal. This corresponds to the axis X-X being substantially horizontal. This is the steady state position that is used during normal operation of the fuel droplet stream generator. However, during a start up process in which the generation of fuel droplets commences there is likely to be a lack of uniformity in the speed and direction of the fuel droplets which has the problem that fuel droplets (e.g., tin droplets) may accumulate on other parts of the EUV source with the potential for damaging the source or at least having a negative effect on performance.

Figure 6:
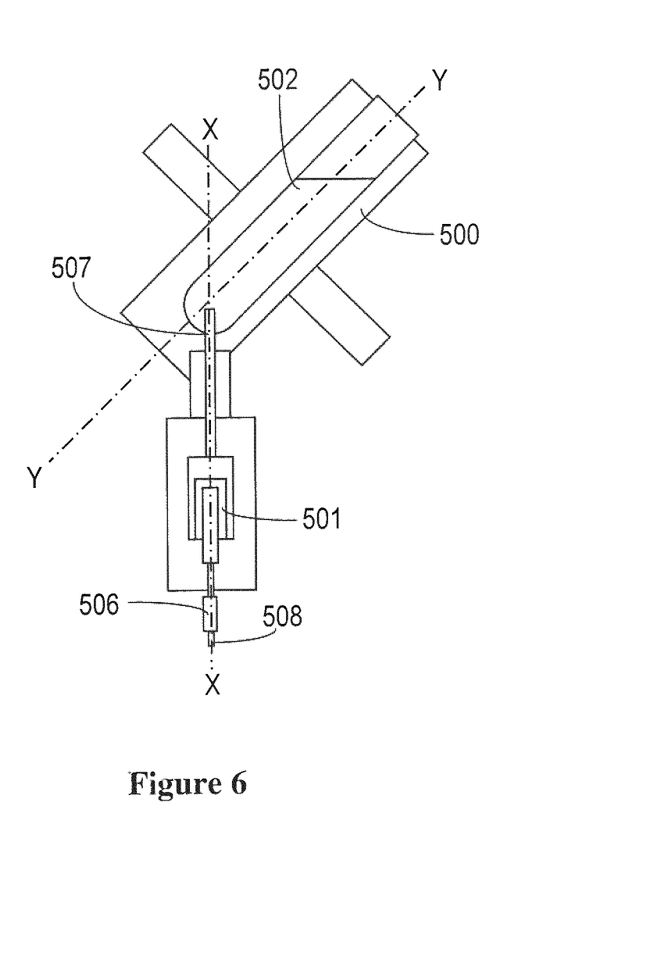
FIG. 6 shows the fuel droplet stream generator of FIG. 5 in a position corresponding to a start-up phase.

Therefore, in an embodiment of the invention, prior to commencing operation of the fuel droplet emitter the emitter is rotated through 90° so that it is in a vertical configuration as shown in FIG. 6 with the emitter nozzle 508 pointing downwardly (i.e., the axis X-X is vertical). The effect of this is that with the emitter in this vertical configuration during the start up process gravity will encourage the fuel droplets to fall vertically downward in a controlled manner to avoid the droplets from falling on other components of the EUV source. A receptacle of some kind can be provided beneath the emitter to catch the droplets.

Figure 7:
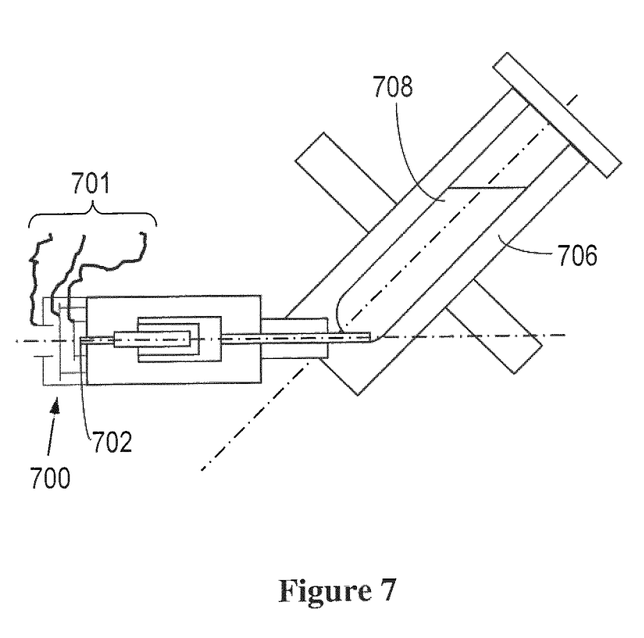
FIG. 7 is a view similar to FIG. 5 but showing another form of fuel droplet stream generator.
Figure 8:
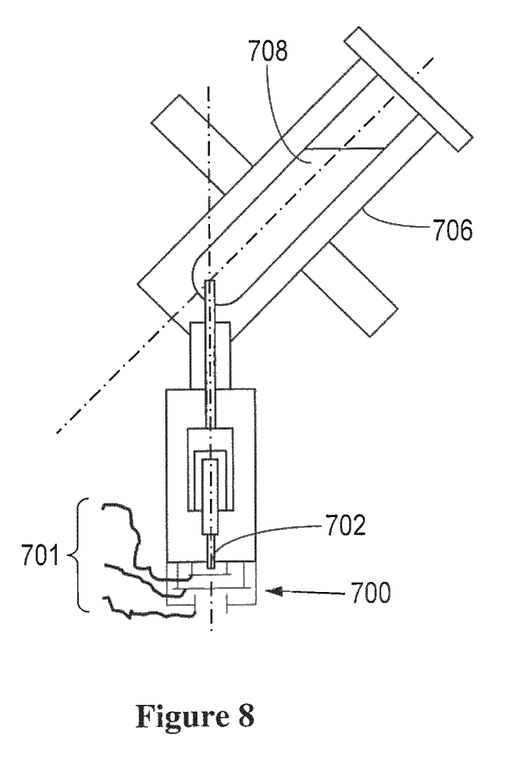
FIG. 8 is a view similar to FIG. 6 but showing another form of fuel droplet stream generator.

FIGS. 5 and 6 show how the present invention can be applied in the context of a droplet stream generator of the type shown in FIG. 3. FIGS. 7 and 8 show how the invention can be applied to an electrostatically driven droplet generator of the type shown in FIG. 4. In this embodiment a number of electrodes 700 are provided fixed to the nozzle corresponding to electrodes 414, 418 and 420 of FIG. 4, and connections 701 are provided for providing appropriate voltages to the electrodes 700 and the nozzle outlet 702. Again it can be seen that the droplet stream generator has a position shown in FIG. 7 for normal use during operation in which the droplet stream is emitted horizontally, and a start-up position shown in FIG. 8 in which the droplets are emitted in a vertically downward position. Fuel such as molten tin 708 is held in a heated reservoir 706 as in the embodiment of FIGS. 5 and 6.

Figure 9:
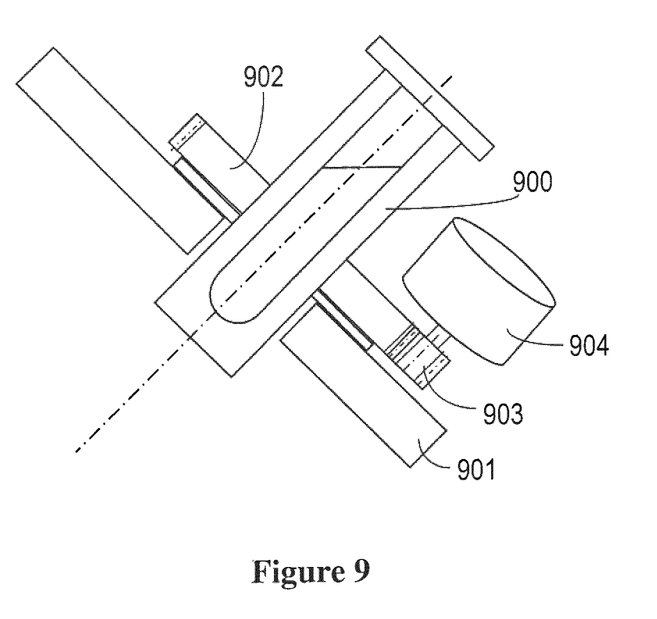
FIG. 9 shows one possible means for moving the fuel droplet stream generator between first and second positions, and FIG. 10 schematically illustrates a visualization system for use in accordance with embodiments of the invention.

FIG. 9 illustrates one possible mechanism for effecting the rotation of the fuel droplet emitter. It will be seen from FIG. 9 that the reservoir 900 is mounted in a wall 901 of the vacuum chamber surrounding the source. The reservoir 900 is mounted for rotation about its axis Y-Y. Fixed to the reservoir 900 is a circular toothed flange 902 the circumference of which is provided with teeth that engage a pinion wheel 903 driven by an electric motor 904. It will be understood that operation of the motor 903 rotates the reservoir 900 about its longitudinal axis. Since the reservoir 900 is fixed to the emitter (not shown in FIG. 9) at an angle, rotation of the reservoir causes rotation of the emitter about an axis extending perpendicularly to the points where axes X-X and Y-Y intersect. This means that rotation of the reservoir causes the emitter to rotated from the horizontal position shown in FIGS. 5 and 7 to the vertical position shown in FIGS. 6 and 8. Continued rotation—or reversed rotation—will move the emitters back from the vertical position to the horizontal position.

An alternative method of enabling the rotation of the emitter from a horizontal position to a vertical position and back would be to attach the droplet generator to a robot arm and to use the robot arm to rotate the generator.

It will be understood that in embodiments of the invention the emitter is moved to the vertical configuration of FIGS. 6 and 8 for a start-up process during which gravity assists in generating a steady stream of fuel droplets. Once the steady state stream of fuel droplets has been established the emitter is rotated back to the horizontal position of FIGS. 5 and 7 for normal operation.

Figure 10:
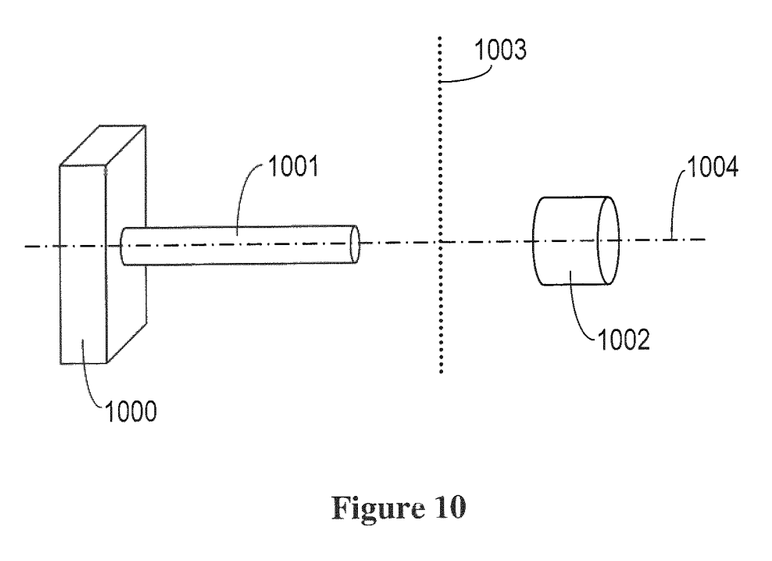

FIG. 10 schematically illustrates a visualization system that may be used to monitor the stream of droplets to determine whether the start-up process has been completed and whether the emitter can be rotated back to the horizontal position. The visualization system comprises a camera 1000, microscope objective 1001, and stroboscope 1002. In FIG. 10 the droplet stream is illustrated by broken line 1003.

The optical axes of the camera 1000, microscope objective 1001 and stroboscope 1002 all lie on a common line of sight 1004 that is perpendicular to the downward stream of droplets. The stroboscope 1002 is tuned to the driving frequency of the droplet emitter such that a still image is formed in the space between the stroboscope 1002 and the microscope objective 1001 and a still shadow image of a droplet is recorded by the camera 1000. Images recorded by the camera 1000 may be transmitted to a display means (not shown) and any deviation from the intended flight path may be detected as a blurring or displacement of the images. Inspection of the images may be performed by a human operator, or more preferably may be carried out by image processing means run on a processor that receives the images from the camera 1000.

The magnification of the images is chosen such that several hundreds of pixels cover the image of the droplet(s). This allows for precise measurement of the area of the droplet, provided the stroboscope time is less than 10 ns for a droplet of 30 microns in diameter travelling at a speed of 100 m/s the motion blur will be about 1 micron resulting in a volume uncertainty of 10%. By using a double flash the velocity of the droplet can also be measured.

For further accuracy a second visualization system with a line of sight perpendicular to both the droplet stream and the line of sight of the first visualization system so that the droplet trajectories can be monitored in two dimensions.

It will thus be understood that the visualization system captures data regarding a number of important droplet properties including trajectory, size and speed and this data is provided in digital form to the processing means. The processing means can compare the data with a predefined specification of desired droplet properties and the processing means may provide feedback control to the droplet generator to adjust the variable parameters of the generator.

Furthermore it will be understood that once the processing means determines from the data received by the visualization system that the droplets meet all the predefined properties and the start-up process has been satisfactorily completed, the droplet generator may be rotated into a horizontal configuration in which the droplets are emitted generally horizontally for use.

An example machine for implementing the processing means in various embodiments of the present invention can be a processor-based computing device. Such a processor based computing device is also commonly referred to as a computer.

A computer system may include one or more processors, one or more non-volatile storage media, one or more memory devices, a communications infrastructure, a display device, and a communication interface. The processor(s) may include any conventional or special-purpose processors including, but not limited to, digital signal processors (DSP), field-programmable gate arrays (FPGA), and application specific integrated circuits (ASIC). A GPU (graphics processing unit) is a specialized processor that executes instructions and programs selected for complex graphics and mathematical operations in parallel. Non-volatile storage may include one or more of a hard disk drive, flash memory, and like devices that may store computer program instructions and data on computer readable media. One or more non-volatile storage devices may be a removable storage device. Memory devices may include one or more volatile memory devices such as, but not limited to, random access memory. Communications infrastructure may include one or more device interconnect buses such as Ethernet, Peripheral Component Interconnect (PCI) and the like. Typically, computer instructions are executed by one or more processors and can be stored in non-volatile storage media and memory devices. Display screen allows results of computer operations to be displayed to a user or an application developer.

Communication interface allows software and data to be transferred between computer system and external devices or other element of a lithography tool/system. Communication interface may include a modem, a network interface (such as an Ethernet card), a communication port, a USB slot and card, or the like. Software and data transferred via communication interface may be in the form of signals which may be electronic, electromagnetic, optical, or other signals capable of being received by communication interface. These signals may be provided to communication interface via a communications path. The communication path carries signals and may be implemented using wire or cable, fiber optics, a phone line, a cellular phone link, an RF link, or other communications channels.

Embodiments can also be directed to computer program products comprising program instructions in the form of software stored on any computer readable medium. Such software when executed by one or more data processing devices causes a data processing device to operate as described herein. Embodiments of the invention can employ any computer readable or readable medium. Examples of computer readable mediums include, but are not limited to, primary storage devices (e.g., any type of random access memory), secondary storage devices (e.g., hard drives, floppy disks, USB's, CD ROMs, ZIP disks, tapes, magnetic storage devices, optical storage devices, MEMs, nanotechnological storage devices, etc.).

Typically, computer instructions are executed by one or more processors and can be stored in a non-volatile storage medium or memory device. Computer instructions can be stored on system in a compiled file, an executable file, or a shared library. Computer instructions can also be included in a routine, a subroutine, or layers of a software stack that are manipulated by processors.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, LED's, solar cells, photonic devices, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A radiation source fuel droplet stream generator comprising:
   a fuel droplet emitter configured to generate a stream of fuel droplets; and
   a droplet visualization system configured to examine the stream of fuel droplets,
   wherein the radiation source fuel droplet stream generator is configured to move said fuel droplet emitter from a first position to a second position based on a determination from the droplet visualization system that the stream of fuel droplets has assumed a steady state when the fuel droplet emitter is in the first position.

2. The radiation source fuel droplet stream generator of claim 1, wherein said first position is a vertical position in which the droplet stream is generated in a downward direction.

3. The radiation source fuel droplet stream generator of claim 1, wherein said second position is a substantially horizontal position in which the droplet stream is generated in a substantially horizontal direction.

4. The radiation source fuel droplet stream generator of claim 1, wherein said visualization system is configured to record images of said droplets to determine droplet parameters.

5. The radiation source fuel droplet stream generator of claim 4, wherein said visualization system comprises a camera, a microscope objective and a stroboscope.

6. The radiation source fuel droplet stream generator of claim 5, wherein said visualization system is configured to view said droplets from two directions.

7. The radiation source fuel droplet stream generator of claim 1, wherein said visualization system is configured provide feedback control to said fuel droplet emitter.

8. The radiation source fuel droplet stream generator of claim 7, wherein the fuel droplet emitter is configured to be rotated between said first and second positions.

9. A radiation source fuel droplet stream generator comprising:
   a fuel droplet emitter configured to generate a stream of fuel droplets, wherein said fuel droplet emitter is configured to be moved between a first position during which said fuel droplets are emitted in a first direction, and a second position during which said fuel droplets are emitted in a second direction; and
   a fuel reservoir connected to said fuel droplet emitter, said reservoir being rotatable about a longitudinal axis disposed at an angle to a longitudinal axis of said fuel droplet emitter whereby rotation of said fuel reservoir about its axis causes said fuel droplet emitter to be moved between said first and second positions.

10. The radiation source fuel droplet stream generator of claim 9, wherein said reservoir is provided with a toothed flange, and wherein said reservoir is driven by an electric motor driving a pinion wheel that engages said toothed flange.

11. The radiation source fuel droplet stream generator as claimed in claim 1, wherein the fuel droplet emitter is configured to move between said first and second positions by a robot arm.

12. A radiation source comprising a fuel droplet stream generator as claimed in claim 1.

13. A lithographic apparatus comprising the radiation source of claim 12, and further comprising an illumination system configured to condition a radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate.

14. A method of generating a fuel droplet stream using a fuel droplet stream generator having a capillary, said method comprising:
   operating said fuel droplet stream generator in a first position so as to generate a stream of fuel droplets in a first direction until a steady state stream is generated; and
   moving said fuel droplet stream generator into a second position in which a fuel droplet stream is generated in a second direction,
   wherein deciding when to move the fuel droplet stream generator between said first and second positions is based upon a determination that the stream of fuel droplets has assumed a steady state when the fuel droplet stream generator is in the first position.

15. The method of claim 14, wherein said first position is a vertical position in which the droplet stream is generated in a downward direction.

16. The method of claim 14, wherein said second position is a substantially horizontal position in which the droplet stream is generated in a substantially horizontal direction.

17. A method of generating a fuel droplet stream using a fuel droplet stream generator having a capillary, said method comprising:
   operating said fuel droplet stream generator in a first position so as to generate a stream of fuel droplets in a first direction that is coaxial with an axis that runs along a center of the capillary until a steady state stream is generated; and
   moving said fuel droplet stream generator into a second position in which a fuel droplet stream is generated in a second direction that is coaxial with an axis that runs along the center of the capillary,
   wherein deciding when to move the fuel droplet stream generator between said first and second positions is based upon the properties of droplets forming said stream.

18. The method of claim 17, further comprising inspecting the droplets to determine whether the droplets meet predefined droplet characteristics.

19. The method of claim 18, wherein said droplets are inspected by capturing images of said droplets.

20. The method of claim 19, wherein images of said droplets are captured from two directions.

* * * * *